US012640596B2

(12) United States Patent
Sautto

(10) Patent No.: US 12,640,596 B2
(45) Date of Patent: May 26, 2026

(54) ADAPTIVE ZERO VOLTAGE SWITCHING FOR NEAR FIELD COMMUNICATION

(71) Applicant: RENESAS ELECTRONICS AMERICA INC., Milpitas, CA (US)

(72) Inventor: Marco Sautto, Zurich (CH)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 419 days.

(21) Appl. No.: 18/498,368

(22) Filed: Oct. 31, 2023

(65) Prior Publication Data

US 2025/0141275 A1     May 1, 2025

(51) Int. Cl.
| | |
|---|---|
| *H02J 50/80* | (2016.01) |
| *H02J 50/12* | (2016.01) |
| *H02M 1/00* | (2007.01) |
| *H02M 1/08* | (2006.01) |
| *H02M 7/219* | (2006.01) |
| *H03K 17/13* | (2006.01) |
| *H03K 17/16* | (2006.01) |
| *H03K 17/296* | (2006.01) |

(52) U.S. Cl.
CPC .............. *H02J 50/80* (2016.02); *H02J 50/12* (2016.02); *H02M 1/0058* (2021.05); *H02M 1/08* (2013.01); *H02M 7/219* (2013.01); *H03K 17/133* (2013.01); *H03K 17/166* (2013.01); *H03K 17/296* (2013.01)

(58) Field of Classification Search
CPC ............ H02J 50/80; H02J 50/12; H02J 50/10; H02M 1/0058; H02M 1/08; H02M 7/219; H02M 1/083; H02M 7/2195; H03K 17/133; H03K 17/166; H03K 17/296; H03K 17/284; H04B 5/79
See application file for complete search history.

(56) References Cited

U.S. PATENT DOCUMENTS

| | | | | |
|---|---|---|---|---|
| 9,112,422 | B1* | 8/2015 | Vinciarelli | ........ H02M 3/33507 |
| 10,116,294 | B1* | 10/2018 | Xu | ........................ H03K 5/1536 |
| 11,336,202 | B1* | 5/2022 | Sautto | ..................... H02M 1/32 |
| 2004/0125627 | A1* | 7/2004 | Nadd | ...................... H02M 1/08 |
| | | | | 363/125 |
| 2014/0334192 | A1* | 11/2014 | Meyer | ................. H02M 3/3385 |
| | | | | 363/21.01 |
| 2014/0334193 | A1* | 11/2014 | Meyer | ................... H02M 7/537 |
| | | | | 363/21.01 |

(Continued)

*Primary Examiner* — Jinsong Hu
*Assistant Examiner* — Rui M Hu
(74) *Attorney, Agent, or Firm* — SCULLY, SCOTT, MURPHY & PRESSER, P.C.

(57) ABSTRACT

Systems and methods for operating a wireless power transfer device are described. A circuit can generate a first signal that indicates a voltage at a node between a first high-side (HS) transistor and a first low-side (LS) transistor in a switching converter falling below ground. The circuit can delay a gate-source voltage of a second LS transistor in the switching converter to generate a second signal. The circuit can merge the first signal and the second signal to generate a third signal. A controller can use the third signal to trigger a rising edge of a command signal to turn on the first LS transistor at a specific time. The first LS transistor being turned on at the specific time reduces a diode conduction time of a body diode of the first LS transistor.

20 Claims, 4 Drawing Sheets

100

(56) References Cited

U.S. PATENT DOCUMENTS

| | | | |
|---|---|---|---|
| 2015/0333801 A1* | 11/2015 | Hosotani | H04B 5/22 |
| | | | 307/104 |
| 2016/0261191 A1* | 9/2016 | Akram | H02M 3/1588 |
| 2017/0019095 A1* | 1/2017 | Leong | H03K 17/167 |
| 2018/0054136 A1* | 2/2018 | Jimichi | H02M 3/33584 |
| 2021/0234534 A1* | 7/2021 | Rochford | H02J 50/12 |
| 2022/0109375 A1* | 4/2022 | Iorio | H02M 3/33592 |
| 2022/0239223 A1* | 7/2022 | Liao | H02M 1/08 |
| 2023/0089458 A1* | 3/2023 | Singh | H02M 1/44 |
| | | | 363/13 |
| 2023/0216425 A1* | 7/2023 | Yang | H02M 7/219 |
| | | | 363/89 |
| 2023/0253893 A1* | 8/2023 | Smith | H02J 50/12 |
| | | | 307/104 |
| 2024/0039274 A1* | 2/2024 | Hou | H02H 9/04 |
| 2024/0106424 A1* | 3/2024 | Nishimura | H03K 5/04 |
| 2024/0259015 A1* | 8/2024 | Matsumoto | H03K 17/168 |
| 2024/0364231 A1* | 10/2024 | Miwa | H02M 1/083 |
| 2025/0253717 A1* | 8/2025 | Russell | H02J 50/80 |

* cited by examiner

400

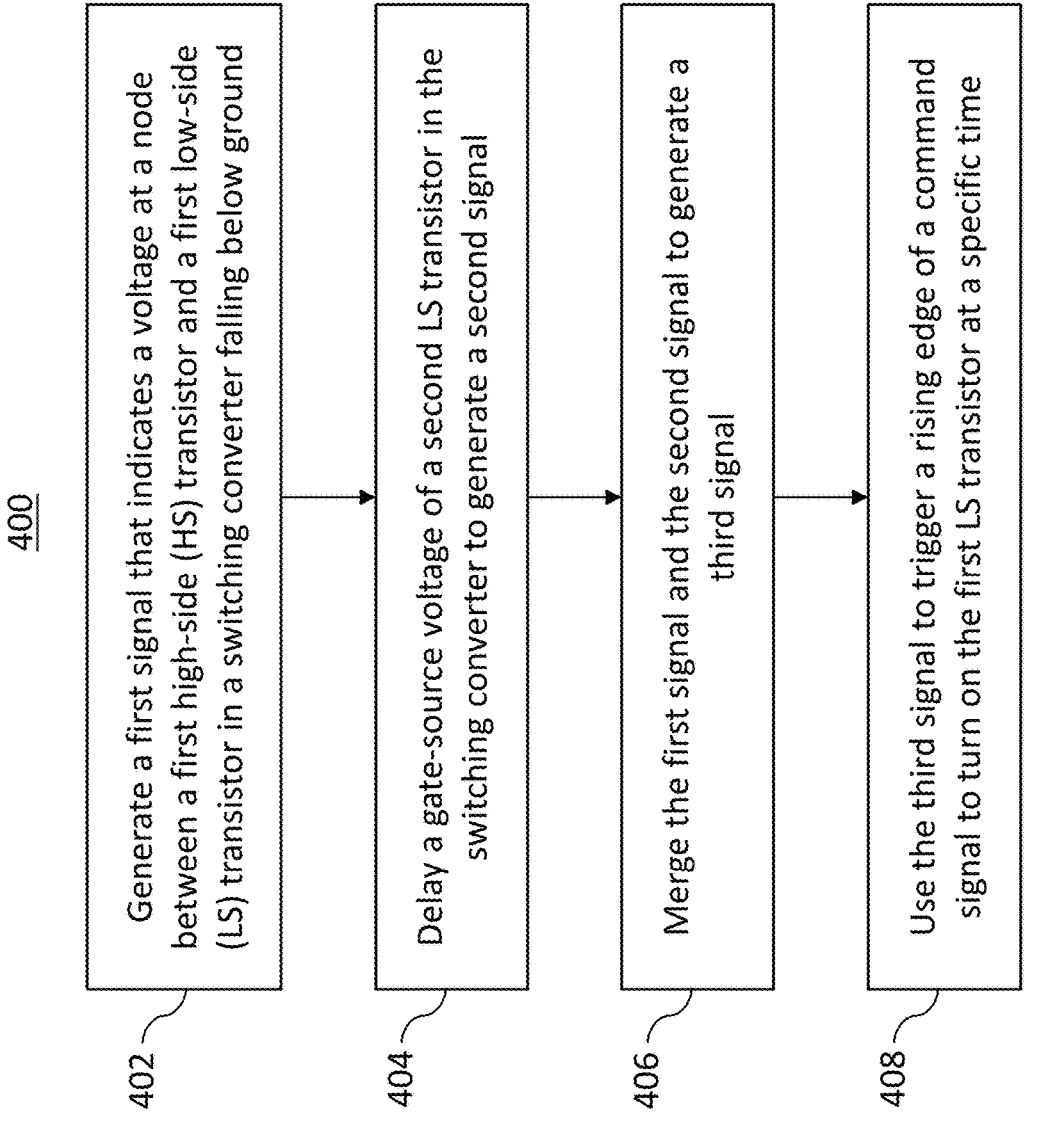

402 — Generate a first signal that indicates a voltage at a node between a first high-side (HS) transistor and a first low-side (LS) transistor in a switching converter falling below ground 404 — Delay a gate-source voltage of a second LS transistor in the switching converter to generate a second signal 406 — Merge the first signal and the second signal to generate a third signal 408 — Use the third signal to trigger a rising edge of a command signal to turn on the first LS transistor at a specific time

Fig. 4

ADAPTIVE ZERO VOLTAGE SWITCHING FOR NEAR FIELD COMMUNICATION

BACKGROUND

The present disclosure relates in general to apparatuses and methods for wireless power transfer devices. Particularly, an operational efficiency of a wireless power receiver can be improved by reducing diode conduction time.

Wireless power transfer using near field communication (NFC) protocol (e.g., NFC wireless power systems) can occur between two devices that include near field communication (NFC) interfaces. Such NFC wireless power systems can include a poller having a transmission coil and a listener having a receiver coil. In an aspect, the poller may be connected to a structure including a wireless charging region. In response to a device including the listener being placed near a device including the poller, the transmission coil and the receiver coil can be inductively coupled with one another to establish an NFC communication link between the poller and the listener and inductive transfer of alternating current (AC) power can occur using the established NFC communication link. The transfer of AC power, from the poller to the listener, can facilitate charging of a battery of the device including the listener.

SUMMARY

In one embodiment, a semiconductor device in a wireless power transfer device is generally described. The semiconductor device can include a controller, a switching converter and a circuit. The switching converter can include a first high-side (HS) transistor, a second HS transistor, a first low-side (LS) transistor and a second LS transistor. The circuit can be configured to generate a first signal that indicates a voltage at a node between the first HS transistor and the first LS transistor falling below ground. The circuit can be further configured to delay a gate-source voltage of the second LS transistor to generate a second signal. The circuit can be further configured to merge the first signal and the second signal to generate a third signal. The controller can be configured to use the third signal to trigger a rising edge of a command signal to turn on the first LS transistor at a specific time. The first LS transistor being turned on at the specific time can reduce a diode conduction time of a body diode of the first LS transistor.

In one embodiment, a semiconductor device for a semiconductor device in a wireless power transfer device is generally described. The semiconductor device can include a comparator configured to generate a first signal that indicates a voltage at a node between a first high-side (HS) transistor and a first low-side (LS) transistor in a switching converter falling below ground. The semiconductor device can further include a delay circuit configured to delay a gate-source voltage of a second LS transistor in the switching converter to generate a second signal. The semiconductor device can further include an OR gate configured to merge the first signal and the second signal to generate a third signal. The OR gate can be further configured to send the third signal to a controller to trigger a rising edge of a command signal to turn on the first LS transistor at a specific time. The first LS transistor being turned on at the specific time can reduce a diode conduction time of a body diode of the first LS transistor.

In one embodiment, a method for operating a wireless power transfer device is generally described. The method can include generating a first signal that indicates a voltage at a node between a first high-side (HS) transistor and a first low-side (LS) transistor in a switching converter falling below ground. The method can further include delaying a gate-source voltage of a second LS transistor in the switching converter to generate a second signal. The method can further include merging the first signal and the second signal to generate a third signal. The method can further include using the third signal to trigger a rising edge of a command signal to turn on the first LS transistor at a specific time. The first LS transistor being turned on at the specific time can reduce a diode conduction time of a body diode of the first LS transistor.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 4 is a flow diagram illustrating a process for implementing adaptive zero voltage switching for near field communication in one embodiment.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

NFC wireless power systems can provide charging under a static mode or a negotiated mode. Static mode can use standard radio frequency (RF) field strength and provides a consistent power level and negotiated mode can use a relatively higher RF field supporting different power transfer classes, such as 250, 500, 750 and 1000 milliwatts (mW). In NFC wireless power systems, the poller and listener can communicate with each other using NFC communication protocols. In an aspect, NFC wireless power systems can use a specific base frequency (e.g., 13.56 Megahertz (MHz)) and leverages the NFC communication link between the two devices to control the power transfer. To perform NFC communication, one device can apply or transfer a modulation signal, for example, amplitude-shift keying (ASK) signal, to the other device, and the other device can demodulate the modulation signal.

Figure 1:
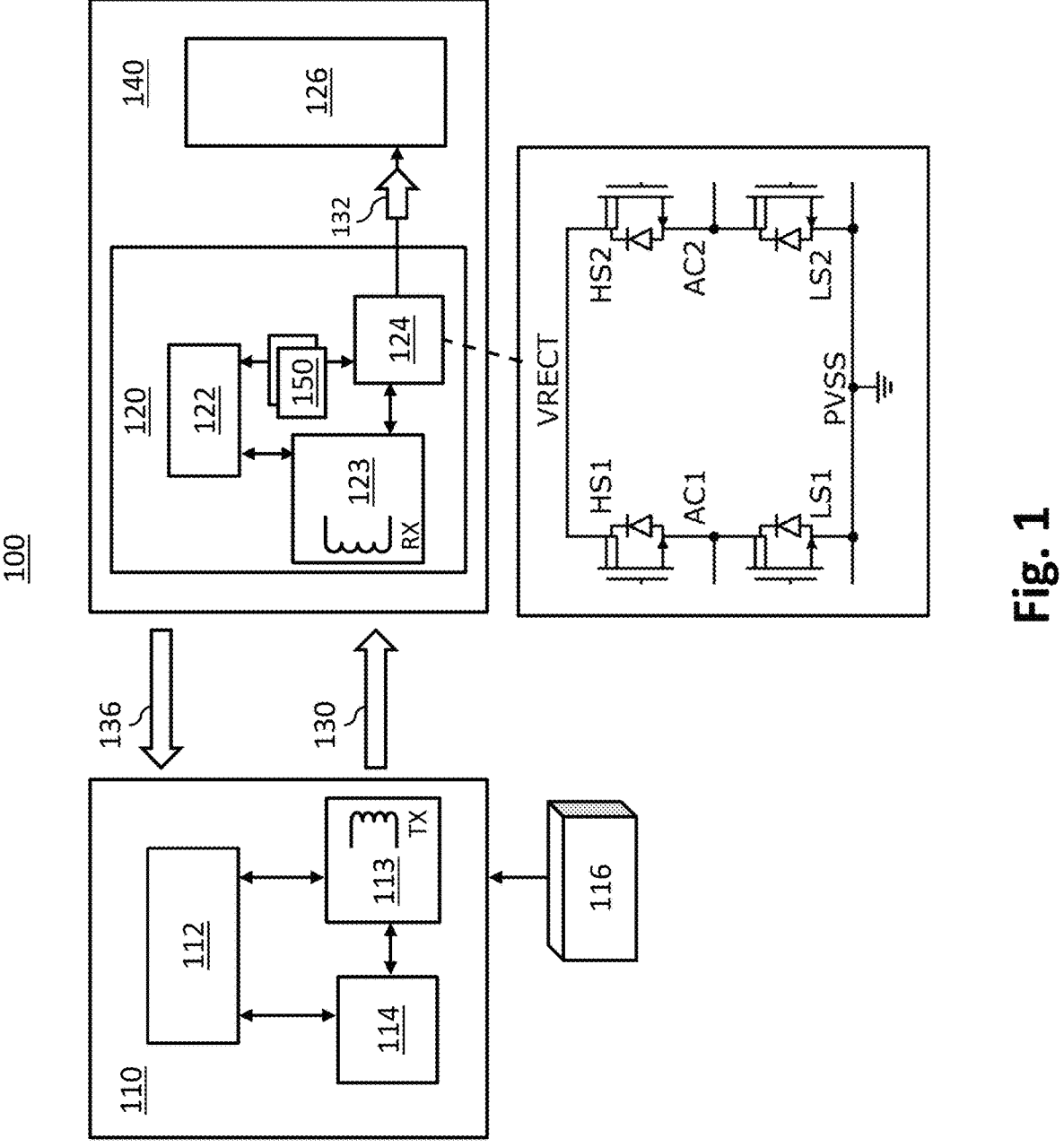
FIG. 1 is a diagram showing an example system that can implement adaptive zero voltage switching for near field communication in one embodiment.

FIG. 1 is a diagram showing an example system that can implement adaptive zero voltage switching for near field communication in one embodiment. System 100 can include power devices, such as a transmitter 110 and a receiver 120, that are configured to wirelessly transfer power and data therebetween via inductive coupling. While described herein as transmitter 110 and receiver 120, each of transmitter 110 and receiver 120 may be configured to both transmit and receive power or data therebetween via inductive coupling. Transmitter 110 can be referred to as a wireless power transmitter and receiver 120 can be referred to as a wireless power receiver. In an embodiment where system 100 is configured as an NFC wireless power system, transmitter 110 can be configured as a poller and receiver 120 can be configured as a listener. Transmitter 110 and receiver 120 can include various types of circuit components such as integrated circuits (ICs) that can be semiconductor devices composed of semiconductor materials.

Transmitter 110 is configured to receive power from one or more power supplies and to transmit AC power to receiver 120 wirelessly. For example, transmitter 110 may be configured for connection to a power supply 116 such as, e.g., an adapter or a DC power supply. Transmitter 110 can be a semiconductor device including a controller 112, a resonant circuit 113, a switching converter 114. Switching converter 114 can be an integrated circuit (IC), that can be a part of a power driver, configured to convert one type of electric current into another type of electric current. By way of example, switching converter 114 can be configured as an inverter to convert a DC signal into an AC signal.

Controller 112 can be configured to control and operate switching converter 114 and other components of transmitter 110. Controller 112 can include, for example, a processor, central processing unit (CPU), field-programmable gate array (FPGA) or any other circuitry that is configured to control and operate switching converter 114. While described as a CPU in illustrative embodiments, controller 112 is not limited to a CPU in these embodiments and may comprise any other circuitry that is configured to control and operate switching converter 114. In an example embodiment, controller 112 can be configured to control switching converter 114 to drive the resonant circuit 113 to produce a magnetic field. Switching converter 114 can drive coil TX at a range of frequencies and configurations defined by wireless power standards, such as, e.g., the NFC Forum's wireless charging (WLC) specifications. The resonant circuit 113 can include a coil TX and one or more capacitors, inductors, resistors, that can form circuitry for outputting various signals and conveying AC power 130 to the receiver 120.

Receiver 120 can be configured to receive AC power 130 transmitted from transmitter 110 and to supply the power to one or more loads, such as a load 126, or other components of a destination device that includes receiver 120. Load 126 can include, for example, a battery charger that is configured to charge a battery, a DC-DC converter that is configured to supply DC power 132 to a processor, a display, or other electronic components of the destination device 140, or any other load of the destination device 140. A destination device can include receiver 120 and can be, for example, a computing device, smart device, wearable device or any other electronic device that is configured to receive power wirelessly. In other embodiments, receiver 120 may be separated from a destination device and connected to the destination device via a wire or other component that is configured to provide power to destination device 140.

Receiver 120 can be a semiconductor device including a controller 122, a resonant circuit 123, a switching converter 124 and a circuit 150. In one embodiment, circuit 150 can be an IC, such as a semiconductor device composed of semiconductor materials. Controller 122 can be an integrated circuit including, for example, a digital controller such as a microcontroller, a processor, CPU, FPGA or any other circuitry that may be configured to control and operate switching converter 124. Resonant circuit 123 can include a coil RX and one or more capacitors, inductors, resistors, that can form circuitry for receiving AC power 130 and outputting communication packets 136. Switching converter 124 can be an IC configured to convert one type of electric current into another type of electric current. By way of example, switching converter 124 can be configured as a power rectifier to convert an AC signal into a DC signal. Power switching converter 124, when configured as a power rectifier, can include a rectifier circuit such as half-bridge rectifiers, full bridge rectifiers, or other types of rectifier circuits that can be configured to rectify power received via resonant coil RX of resonant circuit 123 into a power type as needed for load 126.

As an example, when receiver 120 is placed in proximity to transmitter 110, the magnetic field produced by coil TX of resonant circuit 113 and switching converter 114 induces a current in coil RX of resonant circuit 123. The induced current causes AC power 130 to be inductively transmitted to switching converter 124, via resonant circuit 123. Switching converter 124 receives AC power 130 and converts AC power 130 into DC power 132 for load 126.

Transmitter 110 and receiver 120 are also configured to exchange information or data, e.g., messages, via the inductive coupling of power driver 106 and resonant circuit 113 and 123. For example, before transmitter 110 begins transferring power to receiver 120, a power contract may be agreed upon and created between receiver 120 and transmitter 110. For example, receiver 120 may send communication packets 136 using ASK signals to transmitter 110 that indicate power transfer information such as, e.g., an amount of power to be transferred to receiver 120, commands to increase, decrease, or maintain a power level of AC power 130, commands to stop a power transfer, or other power transfer information. In another example, in response to receiver 120 being brought in proximity to transmitter 110, e.g., close enough such that a transformer may be formed by coil TX and coil RX to allow power transfer, receiver 120 may be configured to initiate communication by sending a signal to transmitter 110 that requests a power transfer. In such a case, transmitter 110 may respond to the request by receiver 120 by establishing the power contract or beginning power transfer to receiver 120, e.g., if the power contract is already in place. Transmitter 110 and receiver 120 may transmit and receive ASK signals, data or other information via the inductive coupling of coil TX and coil RX.

As shown in FIG. 1, switching converter 124 can be formed by two half-bridge circuits including two high-side metal-oxide-semiconductor field-effect transistors (MOS-FETs) HS1, HS2 and two low-side MOSFETs LS1, LS2. The MOSFETs HS1 and LS2 can turn on and off simultaneously and the MOSFETs HS2 and LS1 can turn on and off simultaneously. The pair HS1, LS2 and the pair HS2, LS1 can be switched alternately to rectify AC power 130 into DC power 132. The alternate switching can cause current to flow from node AC1 to AC2 and vice versa alternately. When HS2 and LS1 are turned on, current can flow from AC1 to AC2, during this phase AC1 voltage will go low while AC2 voltage will be high. When HS1 and LS2 are turned on, current can flow from AC2 to AC1, during this phase AC2 voltage will go low while AC1 voltage will be high.

Maximizing operational efficiency is an important aspect of wireless charging. Beyond the environmental impact, operational efficiency impacts the power density and charging time of the portable device. In an aspect, some receivers can utilize Schottky diodes to rectify the received AC power but Schottky diodes can have large forward voltage drop and can limit the receiver to less than 80% efficiency. Some receivers can implement active rectifier using low RDS(on) transistors but active rectifiers may require precise control of the MOSFETs while accommodating the high frequency of the AC signals (e.g., in the range of 13.56 MHz).

In an aspect, when switching converter 124 senses the current flowing through one diagonal (e.g., either LS1-HS2 or LS2-HS1), the corresponding MOSFETs are placed in the ON state, providing a low loss current path. However, there is a delay when turning on the corresponding MOSFETs in the diagonal. During this delay, the current path can go through the body diode of MOSFETs, causing a diode forward voltage drop. The diode forward voltage drop can cause an increase in losses, increasing heat and decreasing operational efficiency. In an aspect, if the delay causes a diode conduction time of more than 3 nanoseconds (ns), then the receiver experience a loss of efficiency of more than 0.7%.

To improve an efficiency of receiver 120, receiver 120 can include at least one circuit 150 that can be configured to perform zero voltage switching (ZVS) control. ZVS control can include monitoring the instance when voltages at nodes AC1 and/or AC2 cross zero voltage (e.g., going below zero or below ground) and performing one or more tasks to control other aspects of receiver 120 in response to the voltages crossing zero voltage. In one embodiment, circuit 150 can monitor the low-side MOSFETs LS1, LS2 and reduce the diode conduction time when the MOSFETs LS1 and LS2 are being switched on. A copy of circuit 150 can be connected across LS1 and another copy of circuit 150 can be connected across LS2. In one embodiment, circuit 150 can measure a voltage across a MOSFET, such as LS1 or LS2 and based on the measured voltage, reduce the diode conduction time of the MOSFET by anticipating the rising edge of gate-source voltages (Vgs) of MOSFET. The reduced diode conduction time can also lead to reduction in electromagnetic interference (EMI).

Figure 2:
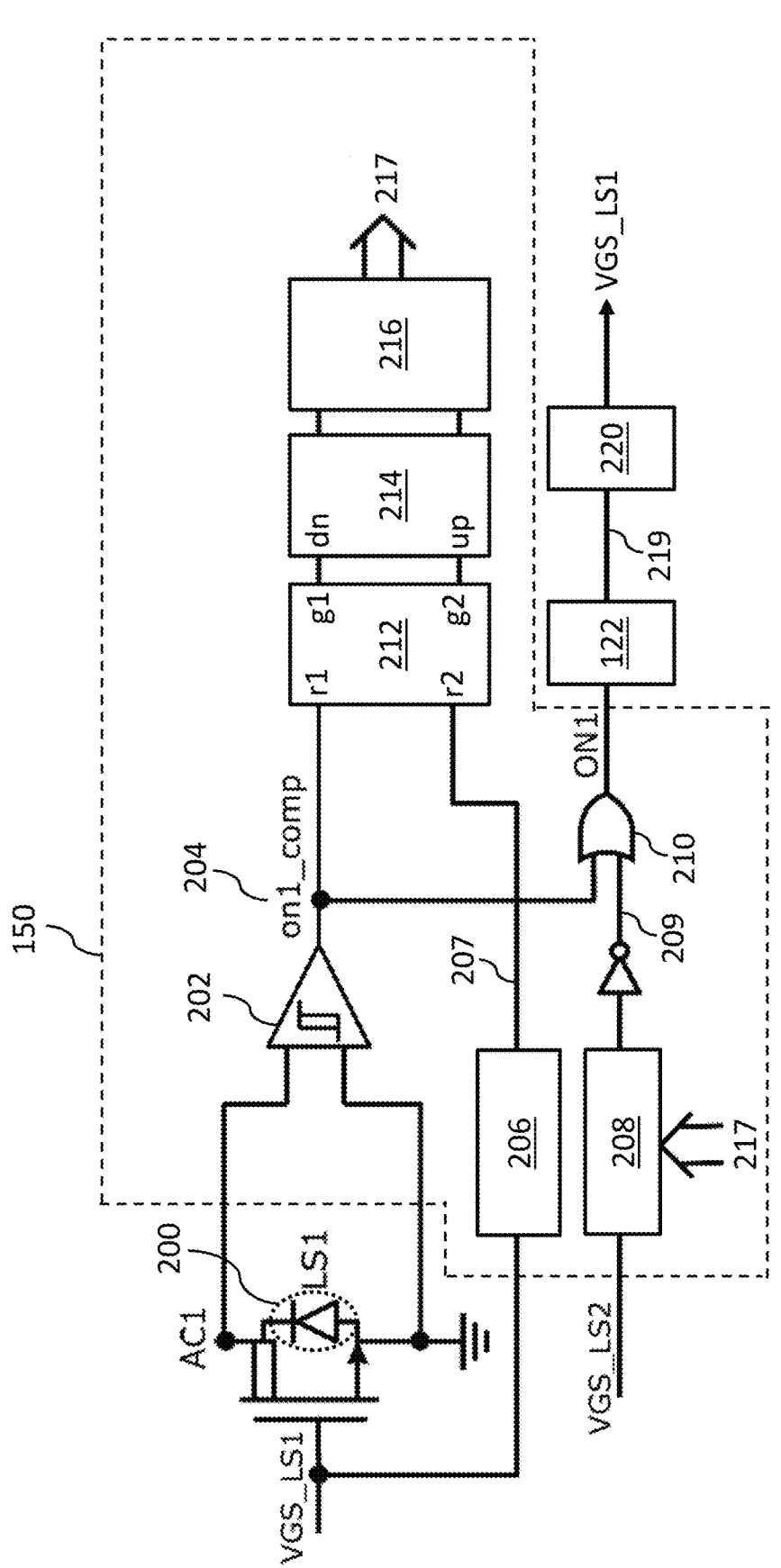
FIG. 2 is a diagram showing an example circuit that can implement adaptive zero voltage switching for near field communication in one embodiment.

FIG. 2 is a diagram showing an example circuit that can implement adaptive zero voltage switching for near field communication in one embodiment. Descriptions of FIG. 2 can reference components shown in FIG. 1. The embodiment shown in FIG. 2 can be an implementation of circuit 150 for monitoring LS1 and reducing diode conduction time of a body diode 200 of LS1. The implementation of circuit 150 shown in FIG. 2 can also be applicable to LS2 of switching converter 124 in FIG. 1. In one embodiment, circuit 150 can be implemented using the components shown in FIG. 2. In the embodiment shown in FIG. 2, circuit 150 can include a comparator 202, a delay circuit 206, a delay circuit 208, an OR gate 210, an arbiter 212, a filter 214, and a counter 216.

Inputs of comparator 202 can be connected across a low-side MOSFET in switching converter 124, such as LS1 or LS2 (LS1 in FIG. 2). Comparator 202 can monitor the voltage at node AC1. A gate-source voltage VGS_LS1 can be applied to the gate of LS1. When VGS_LS1 is greater than a threshold voltage of LS1, LS1 can be turned on. When LS1 is turned on, current can flow through LS1 and the voltage at node AC1 can go low. A voltage outputted by comparator 202, labeled as comparator output 204 or on1_comp signal, can indicate whether the voltage at node AC1 is above ground or below ground (e.g., above zero or below zero).

Circuit 150 can receive gate-source voltages of LS1 (VGS_LS1) and gate-source voltages of LS2 (VGS_LS2). A delay circuit 206 can apply a delay (e.g., a fine tuned delay) on VGS_LS1. Delay circuit 206 can output a delayed VGS_LS1 labeled as signal 207. In one embodiment, the delay being applied by delay circuit 206 can be predefined and fixed, and can be equivalent to the propagation delay of comparator 202. A delay circuit 208 can apply a programmable delay on the falling edge of VGS_LS2, where the programmable delay can be dependent on a delay signal 217. Delay circuit 208 can output a delayed version of the falling edge of VGS_LS2 labeled as signal 209.

Arbiter 212 can be configured to check, cycle by cycle, the order of arrival of signals VGS_LS1 and comparator output 204 (or on1_comp). If on1_comp arrives at the r1 input of arbiter 212 before VGS_LS1 arriving at the r2 input of arbiter 212, then arbiter 212 can output a signal g1. If VGS_LS1 arrives at the r2 input of arbiter 212 before on1_comp arriving at the r1 input of arbiter 212, then arbiter 212 can output a signal g2.

Filter 214 can be a digital filter configured to filter noise from the output of arbiter 212, and can also check if either g1 or g2 are outputted by arbiter 212 for more than one consecutive cycle. If g1 is outputted by arbiter 212 for more than one cycle, then counter 216 can count down by decrementing delay signal 217. If g2 is outputted by arbiter 212 for more than one cycle, then counter 216 can count up by incrementing delay signal 217. The delay signal 217 can be applied to delay circuit 208 to adjust delay being applied on the falling edge of VGS_LS2. In one embodiment, the system (e.g., receiver 120) can eventually reach steady state and counter 216 can stop counting, or alternately increment and decrement delay signal 217 to maintain delay signal 217.

OR gate 210 can receive comparator output 204 and signal 209. OR gate 210 can combine or merge comparator output 204 and signal 209. Controller 122 can receive the ON1 output from OR gate 210. The ON1 being a high voltage (e.g., binary one) can trigger a rising edge of a command signal 219 being outputted by controller 122. Driver 220 can receive the command signal 219 and turns on LS1 by applying VGS_LS1 to the gate of LS1 (e.g., VGS_LS1 goes high). When LS1 is turned on, the body diode 200 can be rectified and ends the diode conduction time.

In an aspect, if circuit 150 is deactivated or the applied delay is too long (e.g. after the power up when the system has not yet reached the steady state), comparator 202 can directly provide comparator output 204 to controller 122 in order to trigger controller 122 to control driver 220 to turn on LS1. Propagation delays in comparator 202, controller 122 and driver 220 can contribute to the diode conduction time of body diode 200 of LS1. The activation of circuit 150 can anticipate a turn on time of LS1 and turn on LS1 earlier than when circuit 150 is deactivated. The earlier turn on time can reduce the diode conduction time of body diode 200 in LS1.

In one embodiment, the ON1 signal being generated based on the delay applied delay circuit 208, and outputted by OR gate 210, can replace the comparator output 204 (on1_comp) to trigger the rising edge of command signal 219 at an earlier time when compared to using on1_comp to trigger the rising edge of command signal 219 (or when circuit 150 is deactivated). The earlier trigger of the rising edge of command signal 219 to turn on LS1 can align the time of the rising edge of the on1_comp signal with the VGS_LS1 signal.

Further, the utilization of arbiter 212 and counter 216, and optionally filter 214, can provide adaptive compensation to the propagation delays and precise control to the alignment of the on1_comp signal and the VGS_LS1 signal. By way of example, if the on1_comp signal lags the VGS_LS1 signal, then signal 207 can arrive at arbiter 212 earlier than comparator output 204. Arbiter 212 can output g2 to trigger counter 216 to increment delay signal 217 to increase the programmable delay being applied by delay circuit 208. The increased delay applied by delay circuit 208 can delay the VGS_LS1 signal to align VGS_LS1 with the lagging on1_comp signal. If the VGS_LS1 signal lags the on1_comp signal, then comparator output 204 can arrive at arbiter 212 earlier than signal 207. Arbiter 212 can output g1 to trigger counter 216 to decrement delay signal 217 to decrease the programmable delay being applied by delay circuit 208. The decreased delay applied by delay circuit 208 can advance trigger the rising edge of the VGS_LS1 signal earlier to align the lagging VGS_LS1 with the on1_comp signal. The adaptive alignment can maintain the reduced diode conduction time of body diode 200 and lead to improvement in efficiency of receiver 120.

Figure 3:
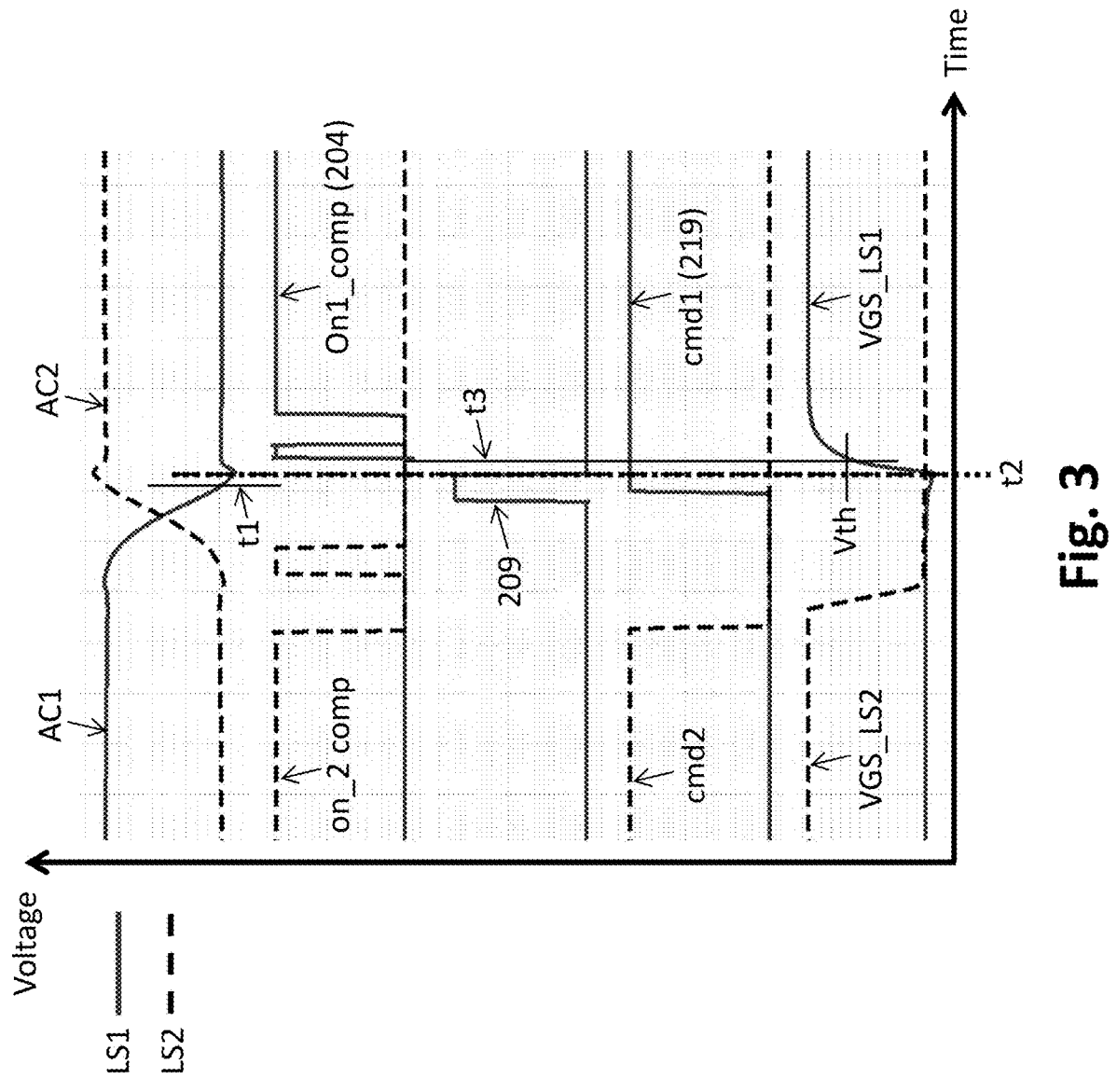
FIG. 3 is a diagram showing waveforms of signals in an example implementation of adaptive zero voltage switching for near field communication in one embodiment.

FIG. 3 is a diagram showing waveforms of signals in an example implementation of adaptive zero voltage switching for near field communication in one embodiment. Descriptions of FIG. 3 can reference components shown in FIG. 1 and FIG. 2. A plurality of waveforms of various signals in an implementation of circuit 150 is shown in FIG. 3. In the waveforms shown in FIG. 3, the voltage at node AC1 can begin to drop below ground at approximately time t1. A propagation delay of comparator 202 can cause comparator 202 to rise the on1_comp signal to high voltage at approximately time t3. The descriptions of FIG. 3 relating to the example implementation of circuit 150 for LS1 can be applicable to implementation of circuit 150 for LS2 as well.

A waveform of signal 209 being outputted by delay circuit 208 is also shown in FIG. 3. The rising edge of signal 209 is a delayed version of the VGS_LS2 falling edge. Signal 209 remains high for a fixed period of time sufficient to be latched by the controller 122. If delay signal 217 increases the delay being applied by delay circuit 208, rising edge of signal 209 will be delayed for longer time. If delay signal 217 decreases the delay being applied by delay circuit 208, signal 209 will be delayed for a shorter time.

Referring to FIG. 2, since signal 209 and on1_comp are being fed into OR gate 210, the output of the OR gate 210, or the ON1 signal, can be high in response to either one or both of signal 209 and on1_comp being high. Signal 209 and on1_comp can be merged by OR gate 210 and the rising edge of the ON1 signal can be triggered relatively earlier to compensate the propagation delay in controller 122 and driver 220. As shown in FIG. 3, when signal 209 is high and on1_comp remains low, command signal 219 being outputted by controller 122 also goes high because the OR gate 210 outputs ON1 as a high voltage. Therefore, the signal 209 can trigger the rising edge of command signal 219 to start turning on LS1 before the rising edge of the on1_comp signal. After the propagation delay of the driver 220, at approximately time t2, VGS_LS1 can start to rise to turn on LS1.

At time t3, the on1_comp signal can rise and VGS_LS1 can exceed the threshold voltage Vth of LS1, thus completely turning on LS1 and the diode conduction time of body diode 200 in LS1 can end. The diode conduction time can start at t1 and end at t3, which is the difference between the propagation time of comparator 202 (e.g., from voltage at AC1 going below ground to rising edge of on1_comp) and the delay applied by circuit 206. Thus, the example in FIG. 3 shows an implementation of circuit 150 where the propagation delay in controller 122 and driver 220 are eliminated, propagation delay of 202 is greatly reduced.

In one embodiment, if the on1_comp signal rises later than t3, then the on1_comp signal lags the VGS_LS1 signal and circuit 150 can increase the delay being applied by delay circuit 208 to increase the rising edge delay of signal 209. In one embodiment, if the on1_comp signal rises earlier than t3, then the VGS_LS1 signal lags the on1_comp signal and circuit 150 can decrease the delay being applied by delay circuit 208 to decrease rising edge delay of signal 209. In one embodiment, a reduction of approximately 300 picoseconds (ps) can result in an operating efficiency improvement of more than 0.7%.

FIG. 4 is a flow diagram illustrating a process to implement adaptive zero voltage switching for near field communication in one embodiment. The process can include one or more operations, actions, or functions as illustrated by one or more of blocks 402, 404, 406 and/or 408. Although illustrated as discrete blocks, various blocks can be divided into additional blocks, combined into fewer blocks, eliminated, performed in different order, or performed in parallel, depending on the desired implementation.

Process 400 can be implemented by a wireless power transfer device (e.g., a receiver, or a transceiver, such as receiver 120 described herein). Process 400 can begin at block 402, where a circuit can generate a first signal that indicates a voltage at a node between a first high-side (HS) transistor and a first low-side (LS) transistor in a switching converter falling below ground. In one embodiment, the switching converter can be in a listener of a near field communication (NFC) power transfer system. In one embodiment, a rising edge of a gate-source voltage of the first LS transistor aligns with a rising edge of the first signal at the specific time.

The process 400 can continue from block 402 to block 404. At block 404, the circuit can delay a gate-source voltage of a second LS transistor in the switching converter to generate a second signal. In one embodiment, the delay being applied to the gate-source voltage of the second LS transistor can be a fixed delay.

The process 400 can continue from block 404 to block 406. At block 406, the circuit can merge the first signal and the second signal to generate a third signal. The process 400 can continue from block 406 to block 408. At block 408, a controller can use the third signal to trigger a rising edge of a command signal to turn on the first LS transistor at a specific time. The first LS transistor being turned on at the specific time can reduce a diode conduction time of a body diode of the first LS transistor.

In one embodiment, the circuit can delay a gate-source voltage of the first LS transistor to generate a fourth signal. The circuit can generate a delay signal based on an arbitration between the first signal and the fourth signal. The circuit can use the delay signal to adjust the delay being applied to the gate-source voltage of the second LS transistor. An adjustment to the delay can adjust the specific time. In one embodiment, the delay being applied to the gate-source voltage of the first LS transistor can be a programmable delay.

In one embodiment, in response to the arbitration indicating the first signal arrives at an arbiter before the fourth signal, the circuit can generate the delay signal to decrease the delay. In response to the arbitration indicating the fourth signal arrives at the arbiter before the first signal, the circuit can generate the delay signal to increase the delay.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
a controller;
a switching converter including a first high-side (HS) transistor, a second HS transistor, a first low-side (LS) transistor and a second LS transistor; and
a circuit configured to:
generate a first signal that indicates a voltage at a node between the first HS transistor and the first LS transistor falling below ground;
delay a gate-source voltage of the second LS transistor to generate a second signal; and
merge the first signal and the second signal to generate a third signal,
wherein the controller is configured to use the third signal to trigger a rising edge of a command signal to turn on the first LS transistor at a specific time, wherein the first LS transistor being turned on at the specific time reduces a diode conduction time of a body diode of the first LS transistor.

2. The semiconductor device of claim 1, wherein the switching converter is in a listener of a near field communication (NFC) power transfer system.

3. The semiconductor device of claim 1, wherein the circuit is configured to:
delay a gate-source voltage of the first LS transistor to generate a fourth signal;
generate a delay signal based on an arbitration between the first signal and the fourth signal; and
use the delay signal to adjust the delay being applied to the gate-source voltage of the second LS transistor, wherein adjustment to the delay adjusts the specific time.

4. The semiconductor device of claim 3, wherein the delay being applied to the gate-source voltage of the first LS transistor is a fixed delay.

5. The semiconductor device of claim 3, wherein:
in response to the arbitration indicating the first signal arrives at an arbiter before the fourth signal, generate the delay signal to decrease the delay; and
in response to the arbitration indicating the fourth signal arrives at the arbiter before the first signal, generate the delay signal to increase the delay.

6. The semiconductor device of claim 1, wherein the delay being applied to the gate-source voltage of the second LS transistor is a programmable delay.

7. The semiconductor device of claim 1, wherein a rising edge of a gate-source voltage of the first LS transistor aligns with a rising edge of the first signal at the specific time.

8. A semiconductor device comprising:
a comparator configured to generate a first signal that indicates a voltage at a node between a first high-side (HS) transistor and a first low-side (LS) transistor in a switching converter falling below ground;
a delay circuit configured to delay a gate-source voltage of a second LS transistor in the switching converter to generate a second signal; and
an OR gate configured to:
merge the first signal and the second signal to generate a third signal; and
send the third signal to a controller to trigger a rising edge of a command signal to turn on the first LS transistor at a specific time, wherein the first LS transistor being turned on at the specific time reduces a diode conduction time of a body diode of the first LS transistor.

9. The semiconductor device of claim 8, wherein the switching converter is in a listener of a near field communication (NFC) power transfer system.

10. The semiconductor device of claim 8, wherein the delay circuit is a first delay circuit, and the semiconductor device further comprises:
a second delay circuit configured to delay a gate-source voltage of the first LS transistor to generate a fourth signal;
an arbiter configured to arbitrate between the first signal and the fourth signal; and
a counter configured to:
generate a delay signal based on the arbitration between the first signal and the fourth signal; and
send the delay signal to the controller to adjust the delay being applied to the gate-source voltage of the second LS transistor, wherein adjustment to the delay adjusts the specific time.

11. The semiconductor device of claim 10, wherein the delay being applied to the gate-source voltage of the first LS transistor is a fixed delay.

12. The semiconductor device of claim 11, wherein the fixed delay is equivalent to a propagation delay of the comparator.

13. The semiconductor device of claim 10, wherein the counter is configured to:

in response to the arbitration indicating the first signal arrives at an arbiter before the fourth signal, generate the delay signal to decrease the delay; and in response to the arbitration indicating the fourth signal arrives at the arbiter before the first signal, generate the delay signal to increase the delay.

14. The semiconductor device of claim 8, wherein the delay being applied to the gate-source voltage of the second LS transistor is a programmable delay.

15. The semiconductor device of claim 8, wherein a rising edge of a gate-source voltage of the first LS transistor aligns with a rising edge of the first signal at the specific time.

16. A method for operating a wireless power transfer device, the method comprising:

generating a first signal that indicates a voltage at a node between a first high-side (HS) transistor and a first low-side (LS) transistor in a switching converter falling below ground;

delaying a gate-source voltage of a second LS transistor in the switching converter to generate a second signal;

merging the first signal and the second signal to generate a third signal; and using the third signal to trigger a rising edge of a command signal to turn on the first LS transistor at a specific time, wherein the first LS transistor being turned on at the specific time reduces a diode conduction time of a body diode of the first LS transistor.

17. The method of claim 16, wherein the switching converter is in a listener of a near field communication (NFC) power transfer system.

18. The method of claim 16, further comprising:

delaying a gate-source voltage of the first LS transistor to generate a fourth signal;

generating a delay signal based on an arbitration between the first signal and the fourth signal; and using the delay signal to adjust the delay being applied to the gate-source voltage of the second LS transistor, wherein adjustment to the delay adjusts the specific time.

19. The method of claim 18, wherein:

in response to the arbitration indicating the first signal arrives at an arbiter before the fourth signal, generating the delay signal to decrease the delay; and in response to the arbitration indicating the fourth signal arrives at the arbiter before the first signal, generating the delay signal to increase the delay.

20. The method of claim 18, wherein a rising edge of a gate-source voltage of the first LS transistor aligns with a rising edge of the first signal at the specific time.

* * * * *